(12) United States Patent
Xie et al.

(10) Patent No.: US 6,334,567 B1
(45) Date of Patent: Jan. 1, 2002

(54) COMPONENT AND METHOD FOR PRODUCTION THEREOF

(75) Inventors: Xiaoming Xie; Zhongzhe Shen, both of Shanghai (CN); Jürgen Freytag, Egelsbach; Frank Stubhan, Rodgau, both of (DE)

(73) Assignees: DaimlerChrysler AG, Stuttgart (DE); Shanghai Institue of Metallurgy, Shanghai (CN)

( * ) Notice: Subject to any disclaimer, the term of this patent is extended or adjusted under 35 U.S.C. 154(b) by 0 days.

(21) Appl. No.: 09/530,273

(22) PCT Filed: Oct. 2, 1998

(86) PCT No.: PCT/EP98/06295

§ 371 Date: Apr. 28, 2000

§ 102(e) Date: Apr. 28, 2000

(87) PCT Pub. No.: WO99/23697

PCT Pub. Date: May 14, 1999

(30) Foreign Application Priority Data

Oct. 30, 1997 (DE) .......................................... 197 47 846

(51) Int. Cl.$^7$ ................................................. B23K 1/06
(52) U.S. Cl. .................................. 228/110.1; 228/180.5
(58) Field of Search ........................... 228/110.1, 180.5, 228/111.5, 111, 4.5; 156/73.2, 580.1, 580.2; 219/56, 56.21, 56.1; 29/872, 873

(56) References Cited

U.S. PATENT DOCUMENTS

| | | | |
|---|---|---|---|
| 3,590,467 A | * | 7/1971 | Chase et al. |
| 3,839,780 A | * | 10/1974 | Freedman et al. |
| 3,857,161 A | * | 12/1974 | Hutchins, IV |
| 3,921,885 A | * | 11/1975 | Knox |
| 4,077,558 A | * | 3/1978 | Carlson et al. |
| 4,620,215 A | * | 10/1986 | Lee |
| 4,895,291 A | * | 1/1990 | Ozimek et al. |
| 4,936,502 A | * | 6/1990 | Schlarb et al. |
| 5,651,494 A | | 7/1997 | Ogino et al. |
| 6,158,647 A | * | 12/2000 | Chapman et al. |

FOREIGN PATENT DOCUMENTS

| | | |
|---|---|---|
| DE | 0 106 598 | 4/1984 |
| DE | 0 186 829 A2 | 7/1986 |
| DE | 42 41 439 A1 | 6/1994 |
| DE | 195 31 158 A1 | 2/1997 |
| DE | 195 32 250 A1 | 3/1997 |
| DE | 195 46 997 A1 | 8/1997 |
| EP | 0 238 066 A2 | 9/1987 |
| FR | 2 656 193 | 6/1991 |
| JP | 58 151977 A | 9/1983 |

OTHER PUBLICATIONS

Patents Abstracts of Japan, vol. 7/No. 27 (M–260) Dec. 3, 1983 JP 58 151977 A.

Heuberger, A., "Mikromechanik" [micromechanics], Springer Publishing House Berlin, Heidelberg, New York, London, Paris, Tokyo 1989, pp. 462–270.

Lee, C.C. et al., "Au–In Bonding Below the Eutectic Temperature", *IEEE Transactions on Comp., Hybrids, and Manufact. Techn.*, vol. 16, No. 3, May 1993, pp. 311–316.

Wilde, J. et al., "Kontaktierung Von Solarzellen Durch Isotherme Erstarrung", Fachbeiträge, 4/93.

\* cited by examiner

*Primary Examiner*—Tom Dunn
*Assistant Examiner*—Jonathan Johnson
(74) *Attorney, Agent, or Firm*—Venable; Norman N. Kunitz

(57) ABSTRACT

The invention relates to a component and to a method for the production. The component is an electronic component with a micro electronic chip and a carrier which is produced by means of isothermal coagulation.

27 Claims, 1 Drawing Sheet

COMPONENT AND METHOD FOR PRODUCTION THEREOF

BACKGROUND OF THE INVENTION

The invention relates to a component and a method for producing the component, in particular it relates to an electronic component with a micro-electronic chip and a carrier.

The method of isothermal coagulation is known for the production of components, particularly the mounting of integrated micro-electronic components on substrates, heat sinks, and the like. A method of this type is described, for example, in German Patent A-195 31 158.

With this method, the micro-electronic components and the heat sink are first coated with metals, wherein at least one metal with low melting point and one metal with higher melting point are used. The metal coatings are brought into direct contact with each other, are heated with a specified temperature progression, and are pressed together during the reaction time, until the reaction between the metal with low melting point and the metal with higher melting point is completed. In the process, the component with low melting point is diffused into the component with higher melting point, thereby resulting in an interconnect layer, which is stable at clearly higher temperatures than the melting temperature for the component with lower melting point. However, the bond is not solid until this isothermal coagulation reaction is completed. For temperatures that can be used with electronic materials, this process can last up to 60 minutes in the range of at most approximately 300° C. and is preferably realized in a vacuum furnace. For this, a relatively high pressure must be exerted onto the bonding location during the total time period for joining the two individual parts, thus making it necessary to have a joining process.

Despite the fact that this type of metallic bonding permits a very advantageous thermal coupling per se of a micro-electronic component to a heat sink or heat expander that may exist, the isothermal coagulation method cannot be used in this case because the necessary joining time is several minutes. Thus, this method is not suitable for a commercial production process for micro-electronic components with typical transit times of a few seconds for fitting the chip onto the carrier.

For lowering the total reaction time and thus also the joining time during which the component must be compressed and the interconnect layer coagulates or the reaction is completed, it is suggested that a material combination be selected, which has a higher growth rate for the intermetallic phase that forms during the isothermal coagulation. A material combination of this type, however, is not suitable for all purposes. According to a further measure to reduce the reaction time, it is suggested that the thickness of the active metal layers be reduced. Cutting the layer thickness in half will reduce the reaction time for many systems to one quarter. However, a lower limit value for the layer thickness reduction is predetermined by the roughness or curvature of the surfaces for the partial elements.

SUMMARY OF THE INVENTION

It is the object of the invention to provide a method for producing a component by means of thermal coagulation, as well as to provide a component that requires a joining time of less than one minute.

The above object generally is achieved according to the present invention by a method for producing a component with an interconnect layer between two partial elements, for which: the first contact side of the first partial element is placed onto a second contact side of the second partial element, wherein the first contact side is coated with a first metallic coating and the second contact side is coated with a second metallic coating, and wherein at least one of the metallic coatings is a component with low melting point and at least one of the metallic coatings is a component with higher melting point; the component is heated to a reaction temperature (T1) over a predetermined temperature course and during a reaction period (t1), until an isothermal coagulation reaction between the first and second metallic coating is completed and the interconnect layer has formed; a joining time (t2) starts at the beginning of the reaction period (t1), which joining time is shorter than the reaction time (t1) and that the partial elements are subjected to a static contact pressure during the joining period (t2); at the beginning of the joining period (t2), the two partial elements are subjected, at least during a fraction of the time for the joining period (t2), to vibration energy (P1) in that at least one of the partial elements is put into longitudinal and/or transverse vibrations. Modified embodiments, as well as advantageous embodiments follow from the descriptive section.

The invention starts by dividing the length of the reaction time into two time segments. The first time segment is characterized by the joining period and the second time segment by the remaining reaction time. The actual process of securely joining partial elements to form a single component is carried out during a joining period within the reaction period, in which the isothermal coagulation takes place. The joining period preferably is shorter than the reaction period.

According to the invention, a dynamic contact pressure in the form of vibration energy, particularly ultrasound energy with a predetermined output, is exerted upon the component or the two partial elements during the joining period. Another advantageous manner of introducing vibration energy consists in exerting a frictional vibration upon one or both partial elements, wherein the contact surfaces that are placed against each other are moved against each other, thereby providing mechanical and/or thermal support for the reaction process of the contact surface materials.

It is particularly preferable if the two partial elements are pressed together with a predetermined, static contact pressure, at least at the start of the vibrations or while these vibrations are effective. It is useful if the contact pressure acts only during the joining period upon the component. It is particularly favorable if the vibration energy and the contact pressure are effective at the same time. The vibration energy preferably should act upon the partial components during a shorter period of time than the length of the joining period. It is particularly preferable if the vibration energy is effective at the start of the joining period.

As a result, the partial elements can be joined mechanically during a very short joining period, such that they have sufficient stability for the further process sequence, as compared to the required actual reaction period while the isothermal coagulation process continues. It is particularly favorable for a production process that the remaining reaction time can be completed at a location other than the joining location where the vibration energy was introduced.

It is advantageous if the time period during which the vibration energy is effective is selected to be shorter if the reaction temperature is selected to be higher.

The time period during which the vibration energy is effective advantageously is between 50 ms and 600 ms.

Preferably, the vibration energy should be effective for a period not to exceed 70% of the joining period. The ultrasound output (P1) that is used should advantageously be between 0.3 W/mm2 and 3 W/mm2.

A static contact pressure (F1) of between 0.2 N/mm$^2$ and 1.5 N/mm$^2$ is favorably used; preferred is the use of the highest possible contact pressure. A preferred static contact pressure is at least 1.5 N/mm$^2$ while an advantageous reaction temperature is between 150° C. and 400° C. A favorable reaction time is between 10 s and 3 minutes.

It is expedient if the method is realized in an inert gas environment, at a temperature that exceeds at least the room temperature.

The first metallic coating should advantageously contain at least one layer of indium, preferably a layer sequence of gold and indium and/or the second metallic coating should contain at least one gold layer and/or one silver layer. It is particularly advantageous if an indium layer at the joining location for both partial elements is brought in contact with a gold layer. Another preferred embodiment provides that two indium layers are deposited, such that they make contact.

It is useful if the metallic coatings are grown on a diffusion barrier layer. A favorable thickness for the diffusion barrier layer is less than 0.5 μm.

A suitable thickness for the first metallic coating is between 3 and 7 μm. The thickness values for the two metallic coatings are adjusted approximately proportional to the inter-metallic phases that form. The thickness of the gold layer should favorably be selected to be approximately half the thickness of the indium layer.

It is particularly advantageous that the indium layer is grown on a thinner layer of gold, which protects an adhesion and barrier layer that may be present.

The first partial element preferably is a micro-electronic chip, particularly a silicon chip, and the second partial element is a heat-conducting body, particularly a silicon body, a ceramic body or a metal body. An interconnect layer of an alloy of AuIn and/or AuIn$_2$ and/or a mixture thereof is positioned between the partial elements.

It is advantageous if the interconnect layer has a diffusion barrier layer to one or both partial elements, particularly a layer of titanium and/or titanium, nickel and chromium. It is particularly advantageous if the interconnect layer is stable at temperatures above 400° C.

The features, insofar as they are essential to the invention, are explained in further detail below and with the aid of Figures.

DESCRIPTION OF THE PREFERRED
EMBODIMENTS

In the following, the invention is explained with the aid of examples from the field of micro-electronics. However, the invention is not limited to this area of application, nor to the materials mentioned in the examples. Rather, the invention is suitable for all materials, which can be used for realizing an isothermal coagulation process.

Isothermal coagulation can be used for creating extremely solid interconnections at relatively low temperatures, wherein these interconnections are stable and can be stressed at much higher temperatures. The principle upon which this interconnection process is based according to prior art consists of arranging an intermediate layer of a metal with low melting point as a foil or as a thin layer between two components having a high melting point. This arrangement is then heated under pressure until the reaction temperature is reached, wherein a liquid intermediate layer forms. In the process, either the melting point for the intermediate layer with low melting point can be exceeded or a renewed reaction takes place between the components with high melting point and those with low melting point.

The melted intermediate layer leads to a relatively quick interdiffusion or reaction diffusion between the components with high melting point and those with low melting point. The subsequent approach to the thermo-dynamic state of equilibrium results in an isothermal coagulation. A solid interconnect layer thus forms. With a corresponding selection of materials for the components with high melting point and those with low melting point, the solid phases that form during the reaction temperature in the interconnect layer have a melting temperature that is clearly above the reaction temperature.

Figure 1:
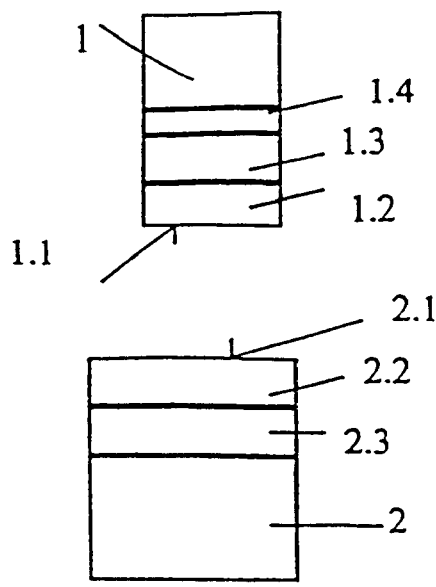
FIG. 1 shows two partial elements with metallic coatings, prior to joining them to form a component according to the invention.

FIG. 1 shows a step at the beginning of the method according to the invention. A first partial element 1, preferred is a micro-electronic chip and especially preferred is a silicon chip, is coated on the contact side 1.1, designed for joining to the second partial element 2, with a metallic coating having several, in particular three, partial layers 1.2, 1.3 and 1.4. The second partial element 2, preferably a substrate with good heat conductance that is to serve as heat sink or heat expander for the chip 1, is also provided with a metallic coating composed of several partial layers 2.2 and 2.3 on the contact side 2.1, intended for the interconnection with the first partial element 1. The second partial element 2 preferably is a silicon substrate or a heat-conducting ceramic or a metal substrate.

The partial element layers 1.2, 1.3, 1.4, 2.2, and 2.3 preferably consists of different metals. The outer layer of one partial element in this case advantageously has a lower melting point than the outer layer of the other partial element.

The outer layer 1.2 of the first partial element advantageously consists of indium, preferably with a layer thickness of 3–7 μm. This outer layer 1.2 is deposited on a second, preferably thinner, layer 1.3 that consists advantageously of the same material with which the isothermal coagulation reaction takes place during the joining process, in particular a gold layer. The layer of gold 1.3 usefully has a layer thickness of around 0.1 μm. It is advantageous if the second layer 1.3 is deposited on a third layer 1.4, which functions as adhering layer and/or diffusion barrier between the isothermal coagulation components and the chip 1. The third layer 1.4 preferably is a combination layer, standard for this purpose, of titanium with admixtures of nickel and chromium or comparable materials. One advantageous layer thickness for this diffusion barrier is, for example, approximately 0.1 μm. One particular advantage due to the second layer 1.3 between the outer partial element layer 1.2 and the diffusion barrier layer 1.4 is that if an isothermal coagulation reaction starts, the reaction for the outer layer 1.2 starts from the contact point as well as from the layer 1.3 and/or the boundary surface to the partial element 1. Thus, a contamination of the reacting layer sequence is prevented through the partial element 1.

The second partial element 2 advantageously also contains an adhesion layer and/or a diffusion barrier layer 2.3, preferably with a composition and thickness that is comparable to the partial element 1. The outer partial layer 2.2 of the second partial element advantageously consists of gold. The thickness of the gold layer 2.2 preferably is selected such that given a complete reaction of the components in the outer layers 1.2 and 2.2 of the two partial elements 1 and 2, a stable inter-metallic compound can form, preferably of AuIn and/or $AuIn_2$ or a mixture thereof. It is therefore advantageous for a combination of indium as the outer layer 1.2 for the first partial element 1 and gold as the outer layer 2.2 of the second partial element 2, if the gold layer thickness is only half that of the indium layer. The indium layer thickness preferably is between 4–7 µm and the the gold layer thickness is around 2 µm.

If different reaction constituents are selected for the isothermal coagulation, it is therefore advantageous if the respective layer thickness of the metal components is correspondingly adapted to inter-metallic phases that may form. The thickness ratios for the metal components with higher melting point and those with lower melting point are preferably selected such that the number of atoms contributing to the reaction are present approximately at the ratio of the composition for inter-metallic phases that form.

The materials selected for this embodiment have the advantage of being compatible. For one thing, the melting point of indium is very low at approximately 160° C., so that during the bonding the thermal stress of the component is low on the heat sink. For another thing, gold is frequently also used in such processes as protective layer for titanium layers. The layer arrangement according to the invention is particularly simple and advantageous since no barrier layers are required between gold and indium.

One advantage of this metallic layer arrangement is that the indium component with low melting point must be deposited only on one partial element. As a result, no coating step with the component with low melting point is required for the second partial element. However, this does not preclude an arrangement where both partial elements are separately provided with respectively one layer of the component with low melting point, particularly an indium layer, which layers are provided as contact layers.

The AuIn and $AuIn_2$ phases that primarily form during the isothermal coagulation are stable at considerably higher temperatures than the melting point for indium. Interconnect layers of this type can be used with temperatures up to 450° C.

The two partial elements 1 and 2 are deposited one on top of the other, so that the two outer layers 1.2 and 2.2, preferably an indium layer and a gold layer, make direct contact. Subsequently, they are heated to a reaction temperature T1, which preferably corresponds to at least the melting point of the component with low melting point; especially advantageous is a temperature between 200° C. and 300° C. No contact pressure must be applied during the heating phase. The reaction temperature T1 preferably does not reach the melting temperature of the component with higher melting point. As opposed to the prior art, it is not necessary to carry out the method in a vacuum furnace or to use a forming-gas environment. It is useful if the reaction is carried out at a higher temperature and with inert gas, particularly nitrogen or argon. This prevents an undesirable oxidation of components, particularly the indium, which may occur during the process and permits advantageously a better perfusion of the gold layer through the indium. A suitable inert-gas flow is between 0.1 liter/min and 1 liter/min. The inert-gas environment is useful, but not critical for the method according to the invention. In particular, the inert-gas environment can be dispensed with completely if the method is automated.

The partial elements are preferably maintained during the total reaction time t1 at the reaction temperature T1. The reaction time t1 for the indium-gold system at a reaction temperature of 300° C. is approximately 15 s, whereas the reaction time t1 climbs to just below 2 minutes if a lower reaction temperature of 200° C. is used. At the reaction temperature, the component with the lower melting point has melted and starts to diffuse into and react with the component having the higher melting point.

For the method according to the invention, it is essential that at the start of the reaction time t1, at least once the reaction temperature T1 is reached, both partial elements 1 and 2 are admitted with vibration energy and move against each other along the contact surfaces. Ultrasound energy is one suitable type of vibration energy. Another expedient vibration energy is generated by frictional vibration between the two partial elements 1, 2, similar to the vibrations during a frictional welding process, wherein both or only one partial element are stimulated to vibrate. The use of this type of vibration energy is particularly favorable for large-surface components. The advantage in this case is that owing to the lower frequency generated during frictional welding, the stress on the component is lower, as compared to the ultrasound.

Locally, the component is preferably located in a joining zone where vibration energy is available. The existence of vibration energy for admitting the component is critical in this case while the output P1 can be selected from a wide range between 0.3 $W/mm^2$ and 3 $W/mm^2$, preferably between 0.5 $W/mm^2$ and 2.5 $W/mm^2$. The vibration energy P1 can act only during a joining period of t2 upon the component. The period during which the vibration energy is effective should be shorter than the joining period t2 and, in particular, it should not exceed 70% of the joining period t2. It is particularly advantageous if the vibration energy acts upon the partial elements at the start of the joining period.

A contact pressure F1 is additionally exerted in the joining zone and during the same time period t2 onto the component. With this contact pressure, the two partial elements 1, 2 are pressed against each other. The component is preferably admitted simultaneously with the ultrasound energy P1 and the contact pressure F1. The contact pressure preferably is between 0.2 $N/mm^2$ and 1.5 $N/mm^2$, especially preferable between 0.25 $N/mm^2$ and 1.25 $N/mm^2$. A contact pressure of, for example, 1–5 N is advantageous with typical chip sizes of 2×2 $mm^2$. It is advantageous if the contact pressure F1 is selected to be as high as possible.

Whereas the reaction time t1 is between approximately 15 s for a reaction temperature of 300° C. and 2 minutes for a temperature of 200° C., the joining time t2 is considerably shorter than the reaction time t1. The effect of the vibration energy at the higher reaction temperature T1 is preferably shortened. In particular, the vibration period is between 50 ms and 600 ms, preferably between 100 ms and 500 ms.

Figure 2:
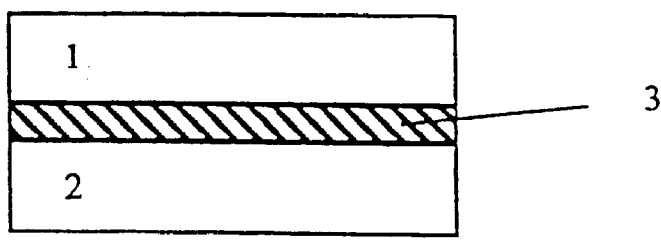
FIG. 2 shows a component according to the invention, following the joining with the method according to the invention.

Despite the fact that the isothermal coagulation reaction is not complete at the end of joining period t2, the bond between the two partial elements 1, 2 is already solid enough, so that no further contact pressure and/or additional ultrasound energy are required to hold the two partial elements 1, 2 together. FIG. 2 shows a component according to the invention, consisting of two formerly separate partial elements 1, 2 that are solidly bonded to an interconnect layer 3, preferably of indium and gold and/or AuIn and/or $AuIn_2$ or a mixture thereof. The component preferably can be removed from the joining zone, meaning the zone where ultrasound and contact pressure are effective, while the reaction temperature T1 is unchanged and the reaction can be completed in another zone, which probably takes 1–4 minutes for the indium/gold system. Subsequently, the component is cooled to room temperature. At the completion of the joining period, the joining zone is available immediately for another joining process. The complete, isothermal coagulation reaction during the total reaction time t1 can subsequently run its course during less critical time zones of the bonding process. The bond is strong enough, so that standard shearing tests with, for example, 0.6 kg/mm$^2$ can be withstood successfully.

A typical production process involves the steps of placing one partial element of the component with a standard tool in a preferably heated joining zone onto the second partial element as mounting surface, in particular a heat sink. The element is held there for the time of one joining period by additionally introducing ultrasound or friction energy. Subsequently, the component is held for the remainder of the reaction time in a reaction zone. The process-critical, so-called pick-and-place time for placing the component onto the mounting surface during the process is here preferably in the range of seconds. Thus, the cycle at which the joining zone is released to be provided with partial elements for a new component is in the range of seconds.

Figure 3:
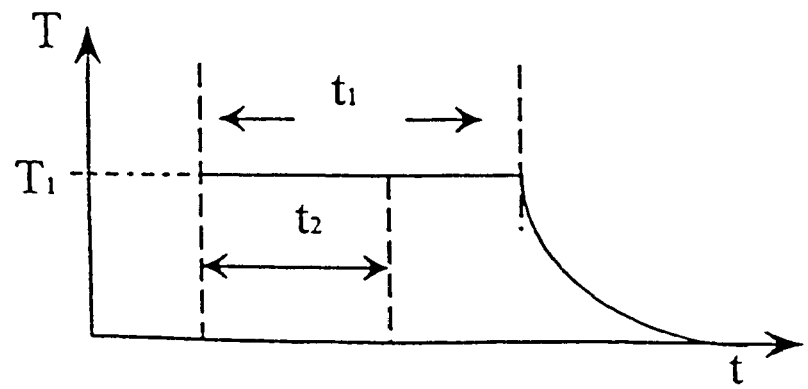
FIG. 3 showsa temperature/time diagram based on the method according to the invention.

FIG. 3 shows a temperature/time diagram based on the method according to the invention. The isothermal coagulation occurs at the reaction temperature T1 during the reaction period t1 and includes the joining period t2, preferably at the start of the reaction period. The joining period t2 preferably covers only a fraction of the reaction period t1.

With this, the method according to the invention can be integrated into a commercial production process where cycle times of only a few seconds can be tolerated for bonding processes of this type. In particular, it is possible to automate the joining process. The total time required for mounting, putting together and joining the partial elements 1, 2 in the joining zone can take less than 5 seconds. This time period can be optimized to require less than 1 second.

A component produced with the method according to the invention has a high heat conductivity, a low electrical resistance of the interconnect layer between the two partial elements, as well as a high melting temperature for the interconnect layer. A micro-electronic component produced in this way is preferred when using high capacities.

Particularly advantageous is the material combination of indium and gold as metal components with low melting point and higher melting point since micro-electronic chips frequently are delivered by the manufacturer with a gold contacting layer on the backside. In the process, a micro-electronic chip of this type can be interconnected easily by means of isothermal coagulation with a standard lead frame, particularly one made of copper or an iron/nickel alloy, especially the so-called Alloy 42. A cheap alternative is to replace all or some of the gold with silver.

In a first preferred embodiment, an indium layer with the corresponding thickness is deposited at least on the chip landing surface of the lead frame or the chip carrier, and the chip is then solidly bonded to the lead frame by using a method according to the invention. It is particularly advantageous if an indium-containing paste is applied to the chip-landing surface. However, the surface provided for accommodating the chip on the lead frame or the chip carrier should advantageously be provided in some sections with a silver coating.

In another preferred embodiment, an indium layer is deposited with the respective thickness on the backside of the chip, intended as contact surface to the carrier. In particular, the indium layer is deposited on a layer sequence of thinner titanium and gold layers. In contrast, the region of the lead frame or the chip carrier, intended for holding the chip, is covered with a layer of gold, having a thickness that matches the indium layer thickness according to the invention. It is expedient and cost-saving if only the immediate chip landing surface is coated with gold, which has the advantage of avoiding for the most part a contamination of the lead frame. The fact that no excess indium remains following the reaction is particularly advantageous. It is favorable if the edge regions of the lead frame or the chip carrier, which are not covered with the gold layer, are additionally provided with a coating that rejects indium.

It is advantageous if the area of the gold layer is only as large as the chip surface. It is particularly favorable if the possibly remaining chip landing surface is covered with a material into which indium cannot diffuse, thus avoiding a contamination of the lead frame with melted indium during the bonding process.

Another advantageous and cost-effective embodiment provides for a silver layer on the lead frame or chip carrier in place of the gold layer. It is advantageous if the indium layer on the backside of the chip is additionally provided with a gold layer, which is thinner than the silver layer.

One preferred embodiment provides that the chip backside, designed for making contact with a lead frame, is coated with a sequence of layers, for which initially a thin titanium layer was deposited on the chip backside, followed by a thin layer of gold and finally a thick layer of indium. The preferred layer thickness is approximately 100 nm for titanium, approximately 100 nm for gold and approximately 4 $\mu$m for indium. On the side that is to be bonded to the chip with the method according to the invention, the lead frame is coated with a thick gold layer, which is approximately half the thickness of the indium layer. The lead frame preferably consists of Alloy 42. A preferred thickness of the gold layer is approximately 2 $\mu$m.

The chip backside of another preferred arrangement, designed to make contact with a lead frame, is provided with a layer sequence, for which initially a thin titanium layer and/or chromium layer was deposited on the backside, followed by a thick indium layer and finally a thin gold layer. The preferred layer thickness involves approximately 100 nm for titanium and/or chromium, approximately 100 nm for gold and approximately 4 $\mu$m for indium. On the side that is to be bonded to the chip with the method according to the invention, the lead frame is coated with a thick gold layer and/or a thick silver layer, with half the thickness of the indium layer. The lead frame preferably consists of Alloy 42. A preferred gold layer thickness is approximately 2 $\mu$m.

In another preferred arrangement, the chip backside that is designed to make contact with a lead frame is coated with a layer sequence, for which initially a thin titanium layer is deposited, followed by a thick indium layer and finally a thick gold layer on the chip backside. The preferred layer thickness is approximately 100 nm for titanium, approximately 2 μm for gold and approximately 4 μm for indium. The led frame is coated on the side that is to be bonded to the chip with the method according to the invention with a very thin layer of silver, having approximately half the thickness of the indium layer. The lead frame preferably consists of Alloy 42. A preferred silver layer thickness is approximately 2 μm.

With yet another cost-effective arrangement, the chip backside for making contact with the lead frame is provided with a layer sequence where initially a thin titanium layer and than a thick gold layer are deposited on the chip backside. On the side to which the chip is to be bonded with the method according to the invention, the lead frame is coated with a thick layer of an indium-containing paste, particularly a screen-printing paste, having approximately twice the thickness of the gold layer. The preferred layer thickness is approximately 100 nm for titanium, approximately 2 μm for gold and approximately 4 μm for the indium paste. The lead frame preferably is composed of Alloy 42.

What is claimed is:

1. A method for producing a component with an interconnect layer between two partial elements, for which
    a) the first contact side of the first partial element is placed onto a second contact side of the second partial element, wherein the first contact side is coated with a first metallic coating and the second contact side is coated with a second metallic coating and wherein at least one of the metallic coatings is a component with a low melting point and at least one of the metallic coatings is a component with a higher melting point,
    b) the component is heated to a reaction temperature (T1) over a predetermined temperature course and during a reaction period (t1), until an isothermal coagulation reaction between the first and second metallic coating is completed and the interconnect layer has formed,
    c) a joining time (t2) starts at the beginning of the reaction period (t1), which joining time is shorter than the reaction time (t1) and the partial elements are subjected to a static contact pressure during the joining period (t2),
    d) at the beginning of the joining period (t2), the two partial elements are subjected, at least during a fraction of the time for the joining period (t2), with vibration energy (P1) in that at least one of the partial elements is put into at least one of longitudinal and transverse vibrations.

2. A method according to claim 1, wherein the vibration energy (P1) is generated with ultrasound energy or through frictional vibrations, having a frequency below the ultrasound range.

3. A method according to claim 1, wherein the partial elements are subjected to at least one of vibration energy (P1) at the start of the joining period (t2) and vibration energy (P1) for a time period not to exceed 70% of the joining period (t2).

4. A method according to claim 1, wherein the ultrasound energy (P1) and the contact pressure (F1) are effective at the same time.

5. A method according to claim 1, wherein the output of the vibration energy (P1) used ranges from 0.3 W/mm$^2$ to 3 W/mm$^2$ or a contact pressure (F1) between 0.2 N/mm$^2$ and 1.5 N/mm$^2$ is used.

6. A method according to claim 1, wherein a contact pressure (F1) of at least 1.5 N/mm$^2$ is used.

7. A method according to claim 1, wherein the reaction period is between 10 seconds and 3 minutes.

8. A method according to claim 1, wherein the fraction of the joining period (t2), during which the partial elements are subjected to vibration energy (P1), is between 50 ms and 600 ms.

9. A method according to claim 1, wherein the reaction temperature (T1) corresponds at least to the melting point of the metal with low melting point and is below the melting point of the metal with higher melting point.

10. A method according to claim 1, wherein the outer surfaces of the contact sides of the partial elements are formed by metals that melt at different temperatures.

11. A method according to claim 1, wherein the outer surfaces of the partial elements are formed by metals that melt at the same temperature.

12. A method according to claim 1, wherein the reaction temperature (T1) is between 150° C. and 400° C.

13. A method according to claim 1, wherein inter-metallic phases are formed in the interconnect layer.

14. A method according to claim 1, wherein the thickness ratios of the metal components with low melting point and the metal components with higher melting point are selected such that the number of atoms of the respective component, which are available for the reaction, are present approximately at the ratio of the composition of the desired inter-metallic phases that are formed during the reaction.

15. A method according to claim 14, wherein the thickness ratios are selected such that an excess of the component with higher melting point exists.

16. A method according to claim 1, wherein the first metallic coating contains at least one layer sequence of gold and indium and the second metallic coating contains at least one layer of gold.

17. A method according to claim 1, wherein at the contact location for the two partial elements, an indium layer is brought into contact with a gold layer or another indium layer.

18. A method according to claim 17, wherein the thickness of the indium layer is between 3 and 7 μm.

19. A method according to claim 17, wherein an indium layer is grown on a thinner gold layer.

20. A method according to claim 17, wherein the thickness of the gold layer is only half the thickness of the indium layer.

21. A method according to claim 1, wherein the component has a diffusion barrier layer between one or both the partial elements and the interconnect layer.

22. A method according to claim 21, wherein the diffusion barrier layer is formed with titanium, nickel and chromium.

23. A method according to claim 21, wherein the diffusion barrier layer contains at least one of titanium, nickel and chromium, or a combination of titanium, nickel and chromium.

24. A method according to claim 1, wherein the first partial element is a micro-electronic chip and the second partial element is a silicone body or a high heat-conducting ceramic body or a metal body.

25. A method according to claim 16, wherein the thickness of the indium layer is between 3 and 7 μm.

26. A method according to claim 16, wherein an indium layer is grown on a thinner gold layer.

27. A method according to claim 16, wherein the thickness of the gold layer is only half the thickness of the indium layer.

* * * * *